(12) United States Patent
Knoll et al.

(10) Patent No.: US 10,002,444 B2
(45) Date of Patent: Jun. 19, 2018

(54) SYSTEM, METHOD AND COMPUTER-ACCESSIBLE MEDIUM FOR JOINT MAGNETIC RESONANCE-POSITRON EMISSION TOMOGRAPHY RECONSTRUCTION USING MULTI-SENSOR COMPRESSED SENSING

(71) Applicant: New York University, New York, NY (US)

(72) Inventors: Florian Knoll, New York, NY (US); Thomas Koesters, New York, NY (US); Ricardo Otazo, New York, NY (US); Fernando Boada, Purchase, NY (US); Daniel Sodickson, Larchmont, NY (US)

(73) Assignee: New York University, New York, NY (US)

( * ) Notice: Subject to any disclaimer, the term of this patent is extended or adjusted under 35 U.S.C. 154(b) by 8 days.

(21) Appl. No.: 14/696,752

(22) Filed: Apr. 27, 2015

(65) Prior Publication Data

US 2015/0310653 A1     Oct. 29, 2015

Related U.S. Application Data

(60) Provisional application No. 61/984,374, filed on Apr. 25, 2014.

(51) Int. Cl.
*G06K 9/00*  (2006.01)
*G06T 11/00*  (2006.01)
(Continued)

(52) U.S. Cl.
CPC .......... *G06T 11/003* (2013.01); *G01R 33/481* (2013.01); *G01R 33/5611* (2013.01); *G06T 11/005* (2013.01)

(58) Field of Classification Search
None
See application file for complete search history.

(56) References Cited

U.S. PATENT DOCUMENTS 7,218,112 B2  5/2007  Ladebeck
9,474,495 B2 * 10/2016  Ahn ...................... G01T 1/1603
(Continued)

FOREIGN PATENT DOCUMENTS

CN          1868406 A    11/2006
CN          100591274    2/2010

OTHER PUBLICATIONS

Guérin, B., et al. "Nonrigid PET motion compensation in the lower abdomen using simultaneous tagged-MRI and PET imaging." Medical physics 38.6 (2011): 3025-3038.*

(Continued)

*Primary Examiner* — Vu Le
*Assistant Examiner* — Samah Beg
(74) *Attorney, Agent, or Firm* — Hunton Andrews Kurth LLP

(57) ABSTRACT

An exemplary system, method and computer-accessible medium for generating a magnetic resonance (MR) image(s) and a positron emission tomography (PET) image(s) of a tissue(s) can be provided, which can include, for example, receiving information related to a combination of MR data and PET data as a single data set, separating the information into at least two dimensions, at least one first of the dimensions corresponding to the MR data and at least one second of the dimensions corresponding to the PET data, and generating the MR image(s) and the PET image(s) based on the separated information.

23 Claims, 9 Drawing Sheets

(51) Int. Cl.
*G01R 33/48* (2006.01)
*G01R 33/561* (2006.01)

(56) References Cited

U.S. PATENT DOCUMENTS

| | | | |
|---|---|---|---|
| 2011/0038560 A1* | 2/2011 | Khare | G06K 9/0057 |
| | | | 382/276 |
| 2013/0182930 A1* | 7/2013 | Trzasko | G06T 11/003 |
| | | | 382/131 |
| 2013/0188854 A1* | 7/2013 | Bilgic | A61B 5/055 |
| | | | 382/131 |
| 2013/0248719 A1* | 9/2013 | Volokh | A61B 6/037 |
| | | | 250/362 |
| 2014/0079304 A1* | 3/2014 | Foo | G06T 11/008 |
| | | | 382/131 |
| 2014/0212012 A1* | 7/2014 | Fain | G01R 33/5601 |
| | | | 382/131 |
| 2015/0029178 A1* | 1/2015 | Claus | G06T 11/005 |
| | | | 345/419 |
| 2015/0065854 A1* | 3/2015 | Ahn | A61B 6/5247 |
| | | | 600/411 |
| 2015/0077112 A1* | 3/2015 | Otazo | A61B 5/055 |
| | | | 324/318 |
| 2015/0309135 A1* | 10/2015 | Axel | A61B 5/0044 |
| | | | 324/309 |
| 2016/0161579 A1* | 6/2016 | Van Den Brink | G01R 33/481 |
| | | | 600/411 |
| 2016/0291105 A1* | 10/2016 | Knoll | G01R 33/481 |

OTHER PUBLICATIONS

Ehrhardt, Matthias J., et al. "Joint reconstruction of PET-MRI by exploiting structural similarity." Inverse Problems 31.1 (2014): 015001.*

Bilgic, Berkin, Vivek K. Goyal, and Elfar Adalsteinsson. "Multi-contrast reconstruction with Bayesian compressed sensing." Magnetic resonance in medicine 66.6 (2011): 1601-1615.*

Rahmim, A., Qi, J., & Sossi, V. (2013). Resolution modeling in PET imaging: theory, practice, benefits, and pitfalls. Medical physics, 40(6).*

Vunckx, K., Atre, A., Baete, K., Reilhac, A., Deroose, C. M., Van Laere, K., & Nuyts, J. (2012). Evaluation of three MRI-based anatomical priors for quantitative PET brain imaging. IEEE transactions on medical imaging, 31(3), 599-612.*

Mameuda, Y., & Kudo, H. (Oct. 2007). New anatomical-prior-based image reconstruction method for PET/SPECT. In Nuclear Science Symposium Conference Record, 2007. NSS'07. IEEE (vol. 6, pp. 4142-4148). IEEE.*

Duarte et al., Compressed Sensing of Jointly Sparse Signals. Conference Record of the Thirty-Ninth Asilomar Conference on Signals, Systems and Computers, pp. 1537-1541 (2005).

Hudson and Larkin. Accelerated image reconstruction using ordered subsets of projection data. IEEE Trans. Medical Imaging, 13: 601-609 (1994).

Daubechies et al., An iterative thresholding algorithm for linear inverse problems with a sparsity constraint. Communications on Pure and Applied Math 57: 1416-1457 (2004).

Kosters et al., EMRECON: An expectation maximization based image reconstruction framework for emission tomography data. IEEE NSS/MIC: 4365-4368 (2011).

Lustig et al., Sparse MRI: The application of compressed sensing for rapid MR imaging. Magn Reson Med 58:1182-1195 (2007).

Vunckx et al., Evaluation of three MRI-based anatomical priors for quantitative PET brain imaging. IEEE Trans. Medical Imaging 31: 599-612 (2012).

Ullisch et al., MR-Based PET Motion Correction Procedure for Simultaneous MR-PET Neuroimaging of Human Brain. PLoS ONE 7(11) (2012.

* cited by examiner

SYSTEM, METHOD AND COMPUTER-ACCESSIBLE MEDIUM FOR JOINT MAGNETIC RESONANCE-POSITRON EMISSION TOMOGRAPHY RECONSTRUCTION USING MULTI-SENSOR COMPRESSED SENSING

CROSS-REFERENCE TO RELATED APPLICATION(S)

This application relates to and claims priority from U.S. patent application No. 61/984,374, filed on Apr. 25, 2014, the entire disclosure of which is incorporated herein by reference.

FIELD OF THE DISCLOSURE

The present disclosure relates generally to a magnetic resonance imaging ("MRI"), and more specifically, to exemplary embodiments of an exemplary system, method and computer-accessible medium for providing a joint magnetic resonance ("MR")-positron emission tomography ("PET") reconstruction, for example, using multi-sensor compressed sensing.

BACKGROUND INFORMATION

Current MR-PET scanners enable simultaneous acquisition of PET and MR data. (See, e.g., Reference 1). However, in the current data processing pipeline, image reconstruction is performed separately for MR and PET data, and the results are only combined at the visualization stage. PET images are reconstructed using the Expectation Maximization ("EM") procedure (see, e.g., Reference 2) or one of its variants, whereas MR data is reconstructed either using an inverse Fourier transform (e.g., a conventional transform) or an iterative procedure in cases such as parallel imaging or compressed sensing.

Thus, it may be beneficial to provide an exemplary system, method and computer-accessible medium for joint MR-PET reconstruction which can overcome at least some of the deficiencies described herein above.

SUMMARY OF EXEMPLARY EMBODIMENTS

An exemplary system, method and computer-accessible medium for generating a magnetic resonance (MR) image(s) and a positron emission tomography (PET) image(s) of a tissue(s) can be provided, which can include, for example, receiving information related to a combination of MR data and PET data as a single data set, separating the information into at least two dimensions, a first of the dimensions corresponding to the MR data and second of the dimensions corresponding to the PET data, and generating the MR image(s) and the PET image(s) based on the separated information.

In some exemplary embodiments of the present disclosure, the dimensions can be at least four dimensions. The dimensions can be generated based on an optimization procedure. Sharing of the MR data and the PET data with one another can be substantially prevented when the MR data and the PET data do not match. In addition, an exemplary sparsifying transform can be applied to the MR image(s) to remove undersampling artifacts from the MR image(s). An initial three-dimensional PET image volume can be generated from the PET data based on an expectation maximization (EM) procedure. The PET image(s) can be updated using the EM procedure. An initial estimation of the MR data can be generated by applying an adjoint of an MR forward operator to the MR data.

In another exemplary embodiment of the present disclosure can be an exemplary system, method and computer-accessible medium for generating a first image(s) and a second image(s) of a tissue(s), which are different from one another, which can include, receiving combined information related to a combination of first imaging information and second imaging information as a single data set, separating the combined information into at least two dimensions into separated information, a first of the dimensions corresponding to the first imaging information and a second of the dimensions corresponding to the second imaging information, and generating the first image(s) and the second image(s) based on the separated information. The first imaging information can be from or based on a first imaging modality, the second imaging information can be from or based on a second imaging modality and the first imaging modality can be different than the second imaging modality. The first imaging modality and/or the second imaging modality can be related to a magnetic resonance imaging modality, a positron emission tomography imaging modality, a single-photon emission computed tomography modality or an optical modality.

According to some exemplary embodiments of the present disclosure, the first imaging information can be or can include magnetic resonance (MR) data, and the second imaging information can be or can include positron emission tomography (PET) data. The first image(s) can be a MR image(s), and the second image(s) can be a PET image(s).

For example, the computer arrangement can be further configured to at least substantially prevent sharing of the first imaging information and the second imaging information with one another when the first imaging information and the second imaging information to not match. A sparsity parameter can be applied to the first imaging information to remove undersampling artifacts from the first imaging information. An initial three-dimensional image volume from the second imaging information can be generated based on an expectation maximization (EM) procedure, and the second image(s) can be updated using the EM procedure.

In certain exemplary embodiments of the present disclosure, the MR data can include measured k-space raw data. The first image(s) and the second image(s) can be generated based on an incoherence of artifacts in the separated information and/or based on a comparison of the separated information. The first image(s) can be generated temporally before the second image(s), and the second image(s) can be generated based on the first image(s)

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

Figure 1:
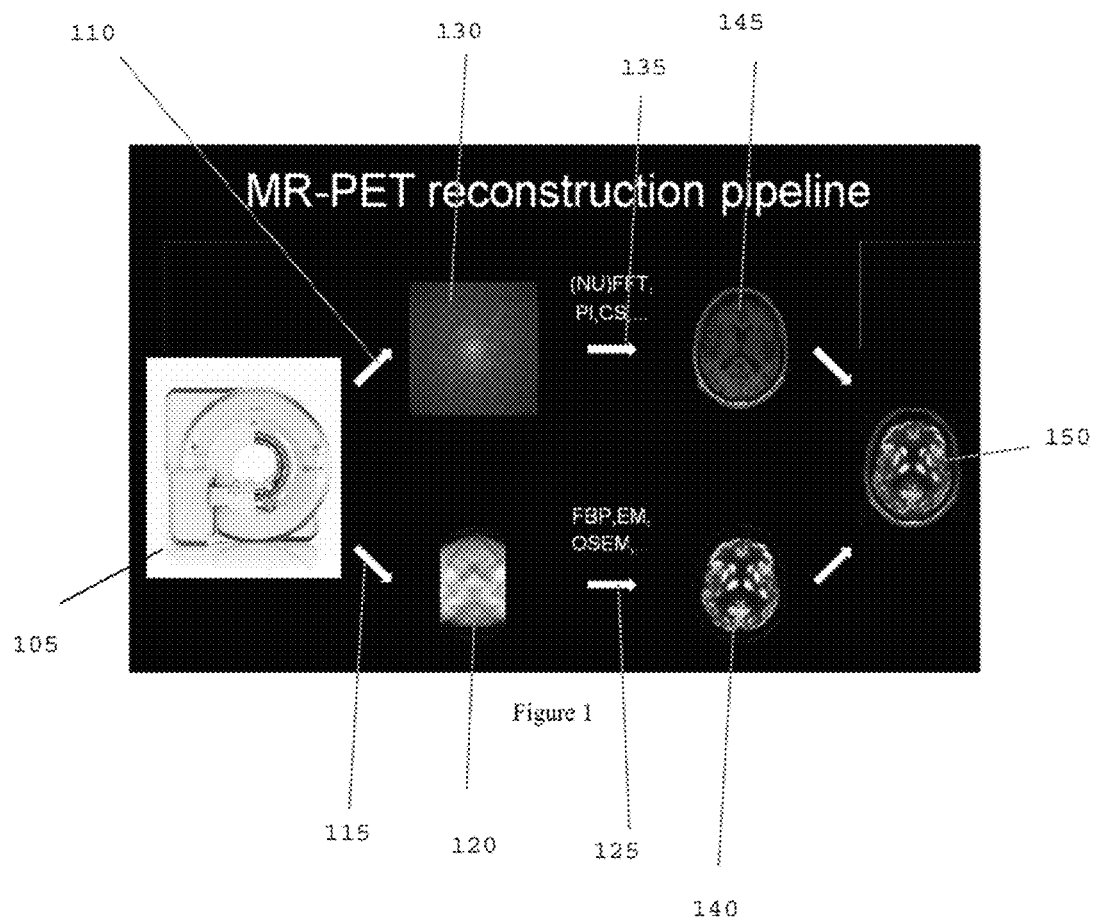
FIG. 1 is a group of exemplary diagrams and images illustrating a conventional magnetic resonance-positron emission tomography procedure.

Throughout the drawings, the same reference numerals and characters, unless otherwise stated, can be used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

FIG. 1 illustrates an exemplary diagram of a conventional MR-PET procedure and an illustration of a conventional device to perform such procedure. In particular, MR and PET data can be acquired at the same time on the same system 105, and can then be separated into two different processing pipelines (e.g., pipelines 110 and 115). PET images 120 can be reconstructed using Filtered Backprojection ("FBP"), expectation maximization ("EM") or ordered subset expectation maximization ("OSEM") (see, e.g., Reference 4) at procedure 125, and the MR data 130 can be conventionally reconstructed using an inverse Fourier transform at procedure 135. After each set of images can be reconstructed (e.g., images 140 and 145), the images can then be fused together for visualization at procedure 150.

Figure 2:
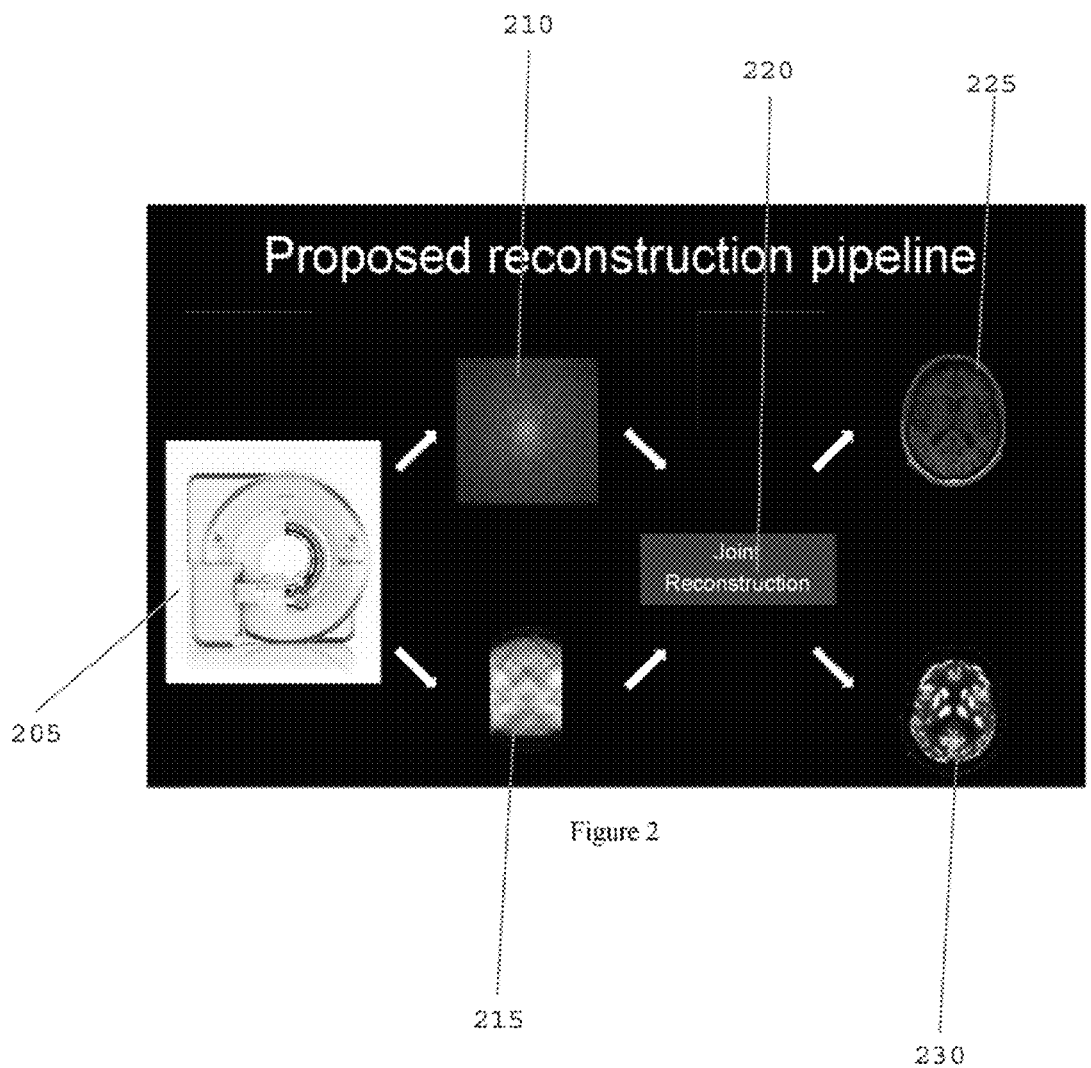
FIG. 2 is a group of exemplary diagrams and exemplary images illustrating a magnetic resonance-positron emission tomography procedure according to an exemplary embodiment of the present disclosure.

In contrast to the procedure shown in FIG. 1, the exemplary system, method and computer-accessible medium according to an exemplary embodiment of the present disclosure, as illustrated in FIG. 2, can acquire MR and PET data using an imaging system 205 (e.g., MR data 210 and PET data 215) as one single data set and jointly reconstruct the MR image 225 and PET image at procedure 220. The exemplary images can then be fused together for visualization in the same way as in the prior art procedure above. By treating the two imaging modalities as additional dimensions of a single dataset, the exemplary method can reconstruct a four-dimensional ("4D") data set by an exemplary solution of the following exemplary optimization problem, where for example:

$$\min\|E(x_{MR}) - k\|_2^2 + \sum_{j=1}^{J} ((A(x_{PET}))_j - f_j \log(A(x_{PET}))_j) + \lambda \left\| \left\| \begin{matrix} \Psi(x_{MR}) \\ \Psi(x_{PET}) \end{matrix} \right\|_2 \right\|_1. \quad (1)$$

where $x_{MR}$ can be a 3D MR image volume, k can be MR k-space raw data, E can map the MR images to 3D k-space and can include coil sensitivity modulation. Mapping the 3D image volume $x_{PET}$ to the sinogram data f. j can be indices of the PET lines of response, and J can be the total number of PET lines of response. Λ can be a regularization parameter and Ψ can be the sparsifying transform. Eq. (1) can include three distinct terms. The first term can enforce data fidelity of the current solution with the acquired MR raw data. The second term can enforce PET data consistency. Here the Kullback-Leibler divergence can be used as a distance measure instead of the l2-norm because of the Poisson noise distribution in PET as opposed to Gaussian noise in MR raw data. The third term can be the joint sparsity, which can be a generalization of the l1-norm to the case of multiple image sets. Two different norms can be needed for the joint sparsity term. The inner l2-norm can combine the transformed MR and PET signal intensities into combined sparse coefficients while the outer l1-norm can sum the combined coefficients and enforces sparsity of the solution. An exemplary definition of the inner l2-norm in Eq. (2) can be given, for example, as follows:

$$\left\| \begin{matrix} \Psi(x_{MR}) \\ \Psi(x_{PET}) \end{matrix} \right\|_2 = \sqrt{\Psi(x_{MR})^2 + \Psi(x_{PET})^2} \quad (2)$$

Iterative soft thresholding (28) can be used as the numerical method to find a minimizer of the cost functional in Eq. (1). The reconstruction procedure is illustrated in FIG. 3.

Figure 3:
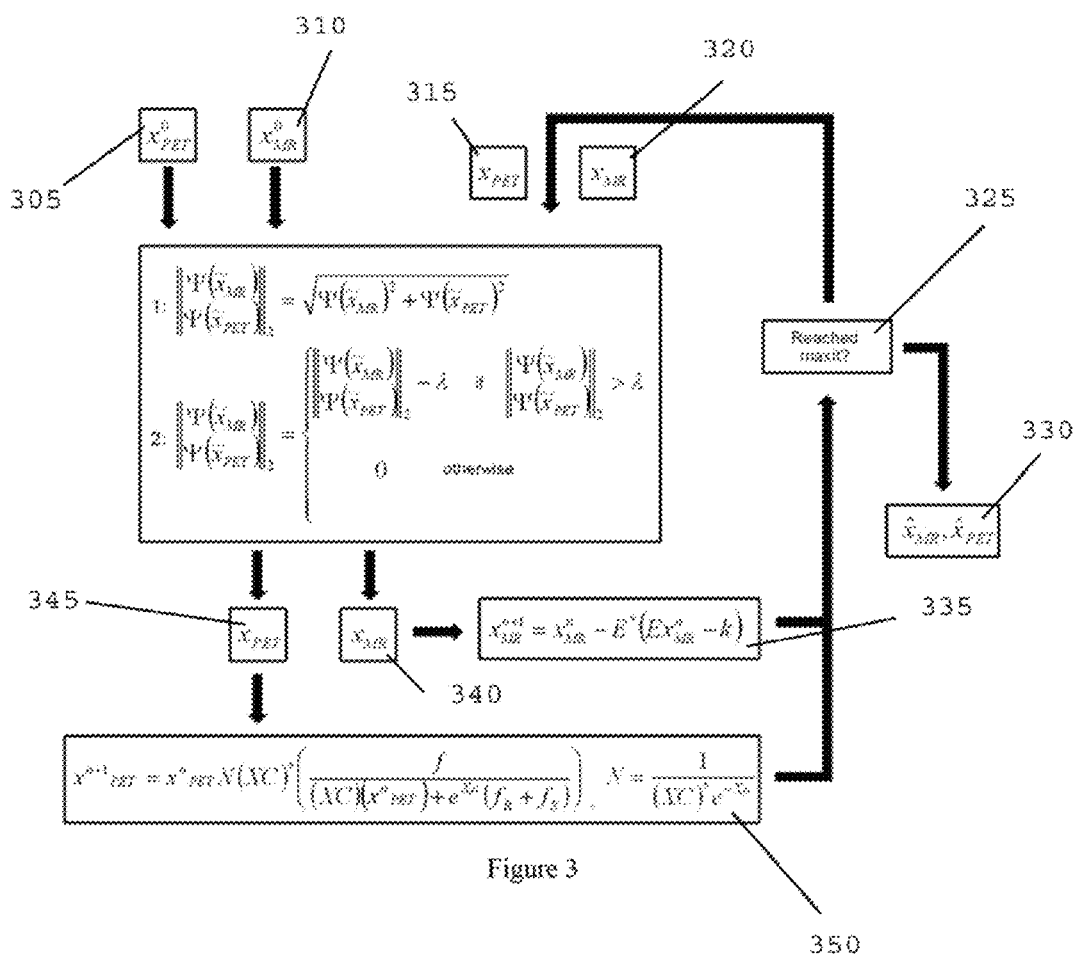
FIG. 3 is an exemplary flow diagram illustrating an exemplary reconstruction pipeline according to an exemplary embodiment of the present disclosure.

As shown in FIG. 3, initial estimates $x^0_{MR}$ (e.g., procedure 310) and $x^0_{PET}$ (e.g., procedure 305) can be selected. For MR, this can be either an all zeroes image or the application of the adjoint of the MR operator to the measured k-space raw data k. In the case of PET, an all ones image can be used. Current estimates of MR (e.g., procedure 320) and PET (e.g., procedure 315) images can then be used in a soft thresholding procedure (e.g., procedure 355) after application of the sparsifying transform Ψ. The output of this exemplary procedure can be updated estimates of MR (e.g., procedure 340) and PET (e.g., procedure 345) images, which can then be subjected to data consistency conditions described below.

The exemplary PET forward operator A, used in the PET data fidelity procedure (e.g., procedure 350), can include two components X and C. X can represent the line model whereas C can be a blurring operator, which can be used to model the point spread function of the scanner. N= 1/(XC)*e-Xµ can account for geometric normalization and attenuation correction. The division can be performed on a voxel by voxel basis. µ can represent the linear attenuation coefficient. Estimates for scattered and random coincidences (e.g., fr and fs) can be added to the forward projection, and can be corrected for attenuation accordingly. Crystal normalization can also accounted for, but can be been omitted in the formula for the sake of simplicity.

Consistency with the acquired MR raw data k can be enforced in the MR image update procedure (e.g., procedure 335. It should be noted that both the MR and PET image updates can follow directly from the two different data fidelity distance measures in Equation 1 due to the different noise statistics of the two modalities. The whole iteration sequence can then be repeated until the defined number of iterations can be reached (e.g., procedure 325). The output of the complete procedure can be a set of MR and PET images (e.g., procedure 330) that can minimize the cost functional from Equation 1.

Initial estimates $x^0_{MR}$ and $x^0_{PET}$ can be selected. For MR, this can be either an all zeroes image or the application of the adjoint of the MR operator to the measured k-space raw data k. In the case of PET, an all ones image can be used. Current estimates of MR and PET images can then be used in a soft thresholding step after application of the sparsifying transform $\Psi$.

The PET forward operator A used in the PET data fidelity procedure can include the two components X and C. X can represent the line model whereas C can be a blurring operator, which can be used to model the point spread function of the scanner. $N=1/(XC)*e^{-X\mu}$ can account for geometric normalization and attenuation correction. The division can be done on a voxel by voxel basis. $\mu$ can represent the linear attenuation coefficient. Estimates for scattered and random coincidences ($f_r$ and $f_s$) can be added to the forward projection, and can be corrected for attenuation accordingly. Crystal normalization can also be taken into account although such consideration can be for the sake of simplicity.

Consistency with the acquired MR raw data k can be enforced or facilitated in the MR image update procedure. For example, both the MR and PET image updates can follow directly from the two different data fidelity distance measures in Eq. (1) due to the different noise statistics of the two exemplary modalities. The whole iteration sequence can then be repeated until the defined number of iterations can be reached.

An exemplary advantage of the exemplary procedure, according to an exemplary embodiment of the present disclosure, can be that while MR and PET can provide unique and independent information, they can be based on the same anatomy. High resolution MR information can be used to enhance the PET reconstruction. In addition, as MR artifacts, like aliasing or geometrical distortions, may not be present in the PET image, a dedicated reconstruction can exploit the incoherence of artifacts in the joint space. The exemplary system, method and computer-accessible medium can therefore facilitate a reconstruction of a higher resolution PET data, for example, without compromising the SNR. Examples of the exemplary reconstruction are illustrated in FIGS. 4 and 5.

An exemplary feature of the exemplary system, method and computer-accessible medium can be that features that can appear exclusively in only one of the two modalities may not be transferred to the second modality. Thus, the exemplary system, method and computer-accessible medium can be robust against this because it may only enforce joint structures. This is illustrated in the example shown in FIG. 5. An interesting exemplary feature of this particular dataset can be the distinct hyper-intense lesion in MR in the cranial slice (e.g., row 505) where no PET tracer accumulation occurs (highlighted by arrows 510). In contrast, the caudal slice (e.g., row 515) includes subcortical gray matter regions (e.g., caudate and thalamus), with no substantial signal correlation at this MR contrast (highlighted by arrows 520). For example, neither of these image features can be affected negatively by the joint reconstruction.

Figure 4:
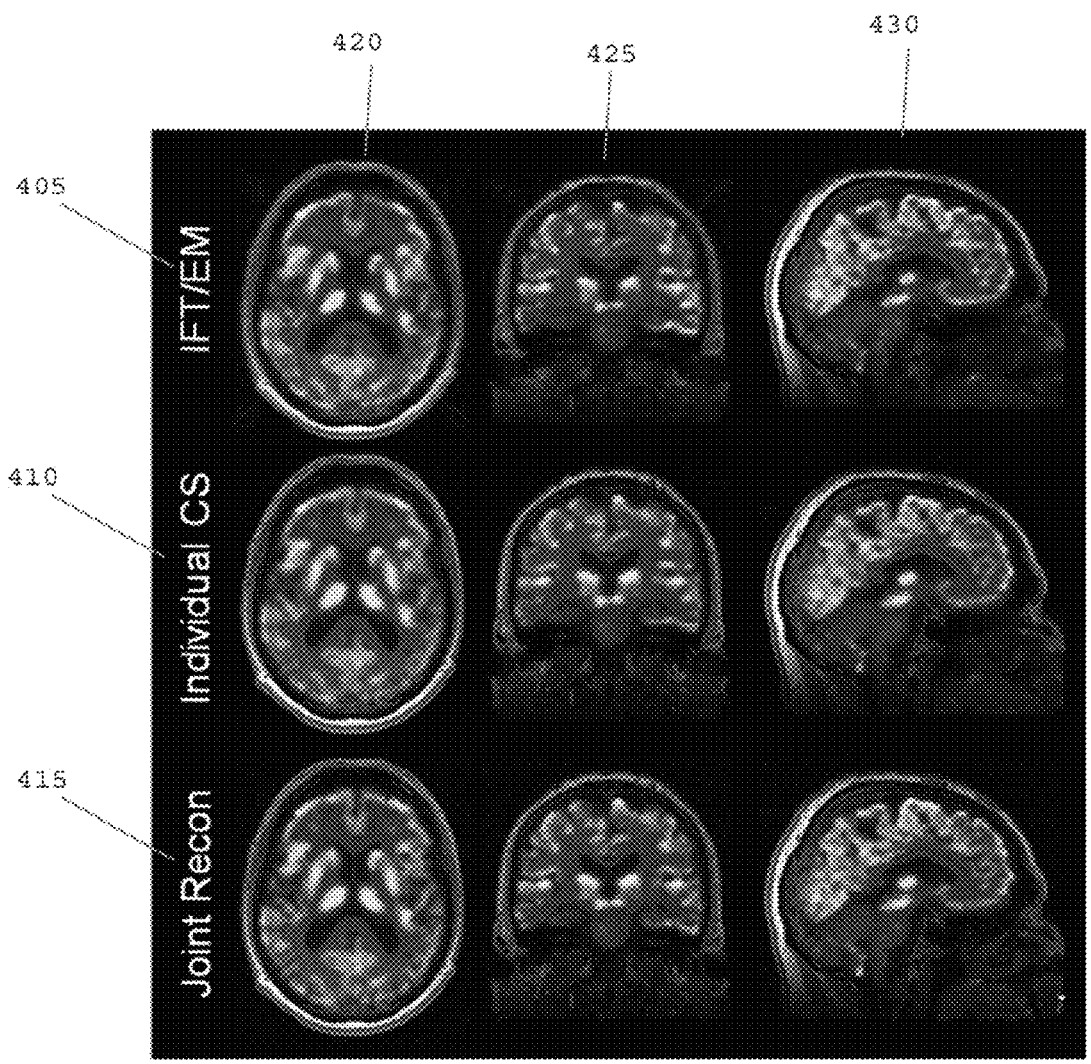
FIG. 4 is a set of exemplary images illustrating a conventional reconstruction procedure, and an individual MR and PET nonlinear compressed sensing reconstruction procedure compared to the exemplary reconstruction procedure.
Figure 5:
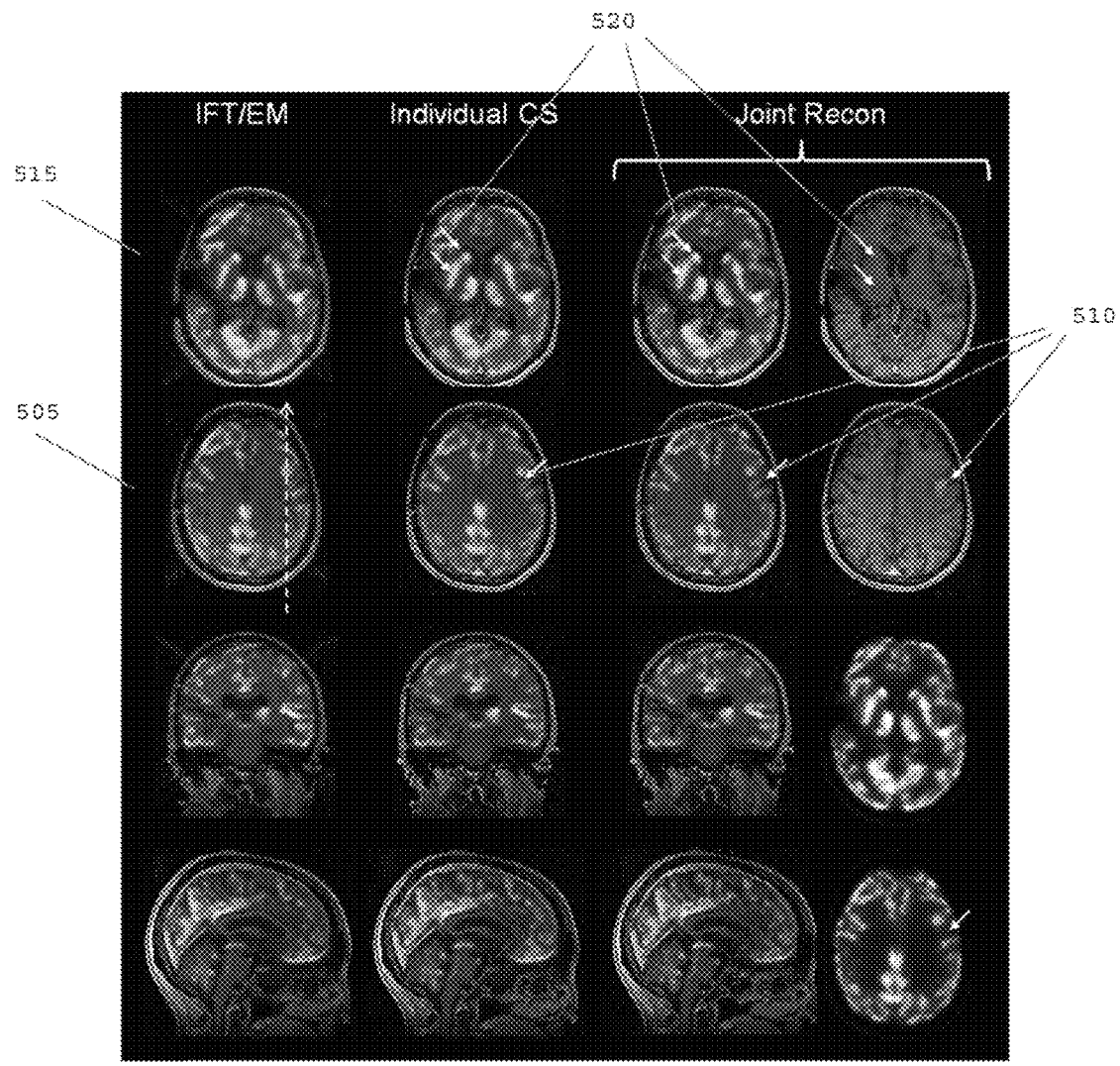
FIG. 5 is a set of exemplary images illustrating image quality of the exemplary reconstruction procedure according to an exemplary embodiment of the present disclosure.

FIG. 4 illustrates a set of images of a prior art (e.g., conventional) inverse Fourier transform-MR and EM-PET reconstruction (e.g., row 405), compared with individual MR and PET nonlinear compressed sensing reconstruction (e.g., row 410), and the exemplary joint image reconstruction for MR/PET data (e.g., row 415). The improved spatial resolution of the PET data produced by the exemplary system, method and computer-accessible medium can be seen in FIG. 4. In particular, superior depiction of the sulcal spaces can be seen in the exemplary joint reconstruction results. Also note that this enhancement may not be present in the individual CS reconstruction, which can demonstrate that the improved resolution can be a consequence of sharing information between the two modalities, not the nonlinear reconstruction in itself.

Two axial slices and coronal and sagittal reformats of the experiments with Cartesian MPRAGE of a brain tumor patient can be performed. FIG. 4 shows, fused MR and PET images from conventional inverse Fourier transform-MR and EM-PET reconstruction (e.g., column 420) compared with individual MR and PET nonlinear compressed sensing reconstructions (e.g., column 425) and the exemplary system, method, and computer-accessible medium reconstruction for MR/PET data (e.g., column 420). An improvement in resolution can be observed with the exemplary system, method and computer-accessible medium. An interesting feature of this particular dataset can be the distinct hyper-intense lesion in MR in the cranial slice (e.g., row 400) where no PET tracer accumulation occurs. In contrast, the caudal slice (e.g., row 405) includes subcortical gray matter regions (e.g., caudate and thalamus), again with no substantial signal correlation at this MR contrast. For example, neither of these image features can be affected negatively by the joint reconstruction. The position of the cross sectional plot in FIG. 6A is indicated with a dashed arrow 605 in the IFT/EM reconstruction of the cranial slice.

Figures 6A, 6B:
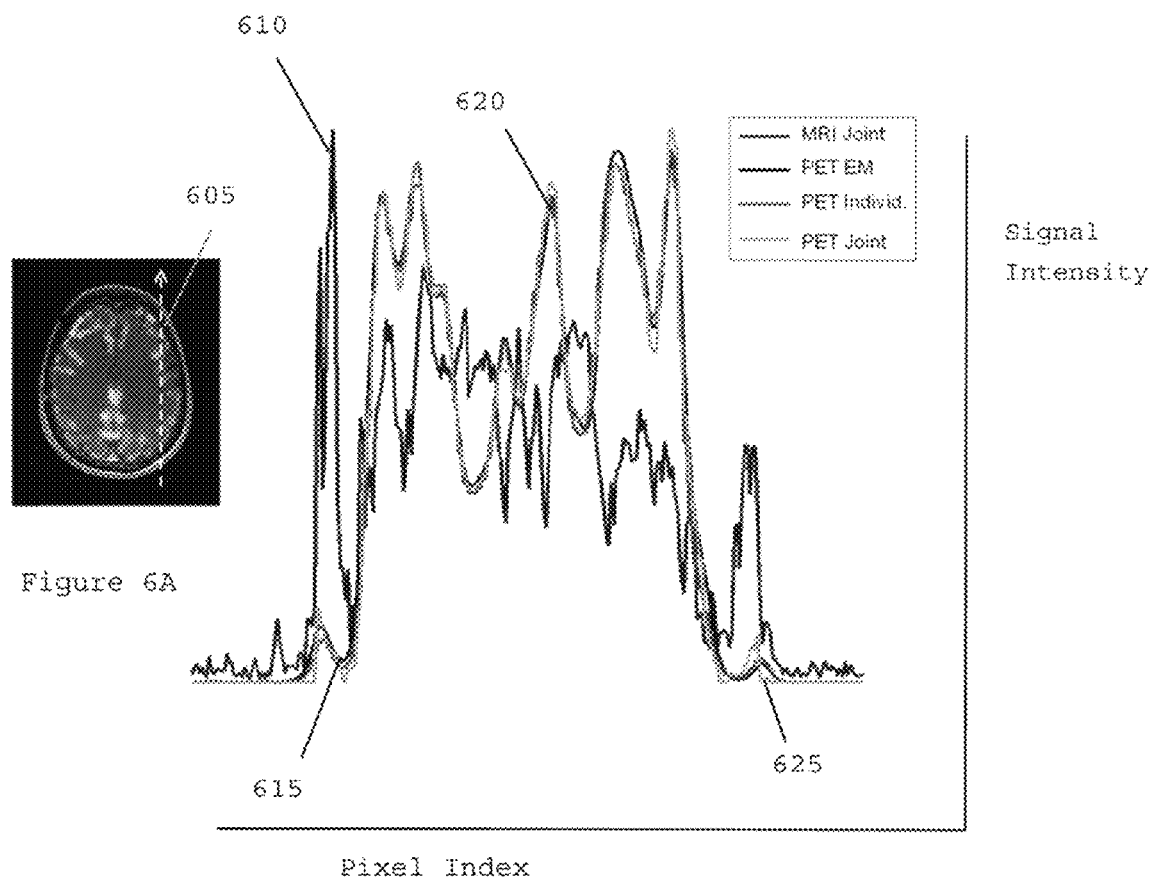
FIG. 6A is an exemplary image of a cross-sectional profile of a cranial slice according to an exemplary embodiment of the present disclosure.
FIG. 6B is an exemplary graph illustrating cross-sectional profile plots according to an exemplary embodiment of the present disclosure.

This can be further demonstrated with cross-sectional profile plots across this particular lesion (see, e.g., FIG. 6B). Exemplary graphs are shown for jointly reconstructed MRI (curve 610), PET EM (curve 615), PET individual CS (curve 620) and jointly reconstructed PET (curve 625). While jointly reconstructed PET shows some sharper edges in areas where MRI also exhibits sharp edges, no systematic bias of the PET signal values can be introduced by the joint reconstruction.

Figure 7:
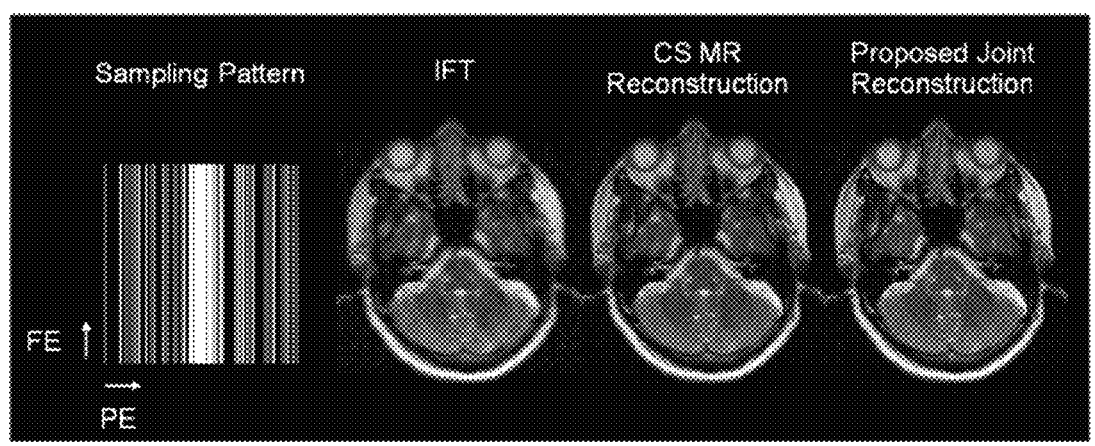
FIG. 7 is a set of exemplary images illustrating a pseudorandom one-dimensional subsampling pattern according to an exemplary embodiment of the present disclosure.

While the exemplary results from FIGS. 4 and 5 demonstrate image quality enhancement for PET using the exemplary system, apparatus, method and computer-accessible medium according to an exemplary embodiment of the present disclosure, the exemplary joint reconstruction procedure can also be beneficial for MR data acquisition in cases when MR images can be reconstructed from under-sampled (e.g., accelerated) data sets. FIG. 7 shows asset of exemplary image of a pseudorandom one-dimensional ("1D") subsampling pattern with 3-fold acceleration and corresponding inverse Fourier transform ("IFT") reconstruction, MR-compressed sensing reconstruction and the exemplary joint reconstruction with PET data, according to an exemplary embodiment of the present disclosure. The exemplary results shown in FIG. 7 can be reconstructed from a 3-fold accelerated data set using a 1D pseudorandom subsampling pattern in phase encoding ("PE") direction.

Results using a prior art IFT reconstruction, MR-only compressed sensing (see, e.g., Reference 7) and the exemplary joint reconstruction with PET data are shown. Joint reconstruction results indicate superior sharpness and detectability of small structures using the exemplary system, method and computer-accessible medium, as compared to compressed sensing alone.

The exemplary system, method and computer-accessible medium, according to an exemplary embodiment of the present disclosure, can provide various advantages over previous systems as it can treat MR and PET data as one single dataset during image reconstruction, and it can exploit correlations of the underlying anatomy of the two datasets. This can facilitate the reconstruction of PET images with higher resolution and better SNR, and in the exemplary PET reconstruction with MR anatomical priors (see, e.g., Reference 8), MR image reconstruction can be performed as a separate procedure and these images can then be used to enhance PET images. The exemplary system, method and computer-accessible medium, according to an exemplary embodiment of the present disclosure, can also operate directly with both MR and PET measurement data. This can also apply to the exemplary motion correction approach described above.

Additionally, the exemplary system, method and computer-accessible medium according to an exemplary embodiment of the present disclosure, can (i) reconstruct PET images with higher resolution; (ii) reconstruct PET images with higher SNR; (iii) provide faster acquisition of both MR and PET data; (iv) improve quantitative assessment; (v) reduce artifacts from technical sources and patient motion; and/or (vi) incorporate dynamic correlations into the exemplary joint reconstruction framework.

Additionally, the exemplary system, method and computer accessible medium can be used with various other imaging modalities including an optical imaging modality, Single-photon emission computed tomography ("SPECT"), or any imaging modalities that can share some common elements.

Figure 8:
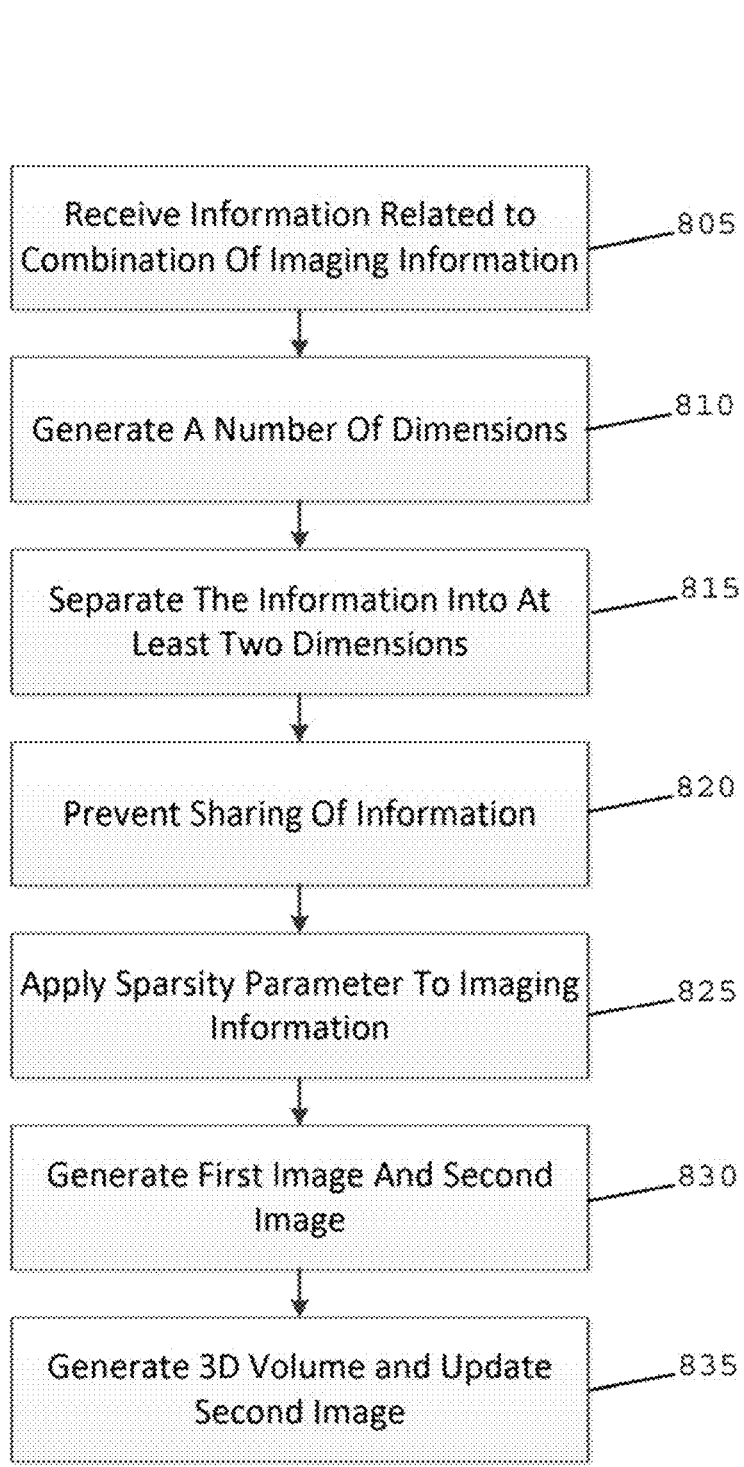
FIG. 8 is a flow diagram of an exemplary method for generating a first image and a second image of tissue according to an exemplary embodiment of the present disclosure.
Figure 9:
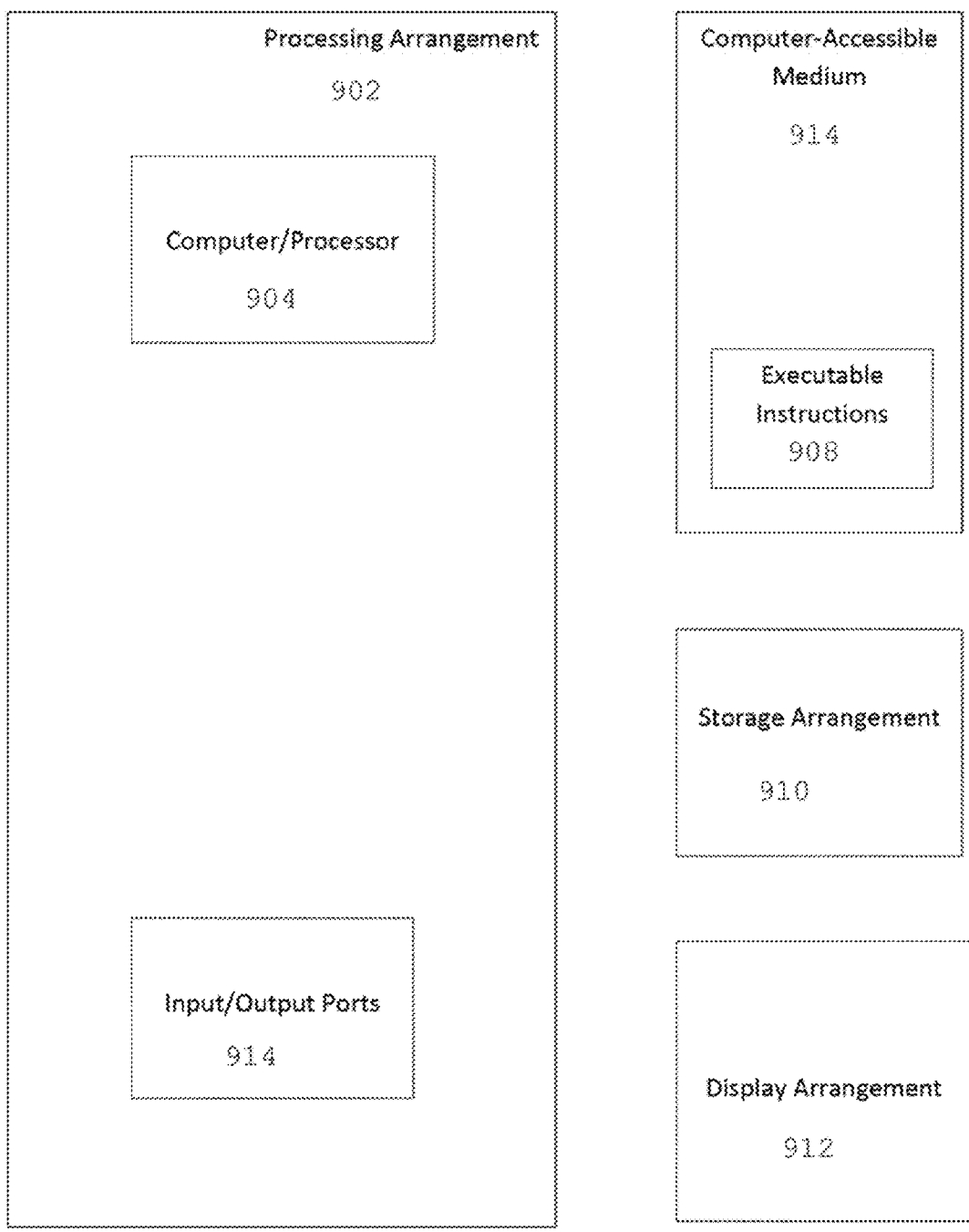
FIG. 9 is an illustration of an exemplary block diagram of an exemplary system in accordance with certain exemplary embodiments of the present disclosure.

FIG. 8 is a flow diagram of an exemplary method 800 for generating a first image and a second image of a tissue according to an exemplary embodiment of the present disclosure, which can be performed, e.g., by an exemplary system of FIG. 9. For example, at procedure 805, information related to a combination of first imaging information and second imaging information as a single data set can be received, which can be MR and PET imaging information. At procedure, 810, a number of dimensions can be generated, and the information can be separated into at least two dimensions at procedure 815, where at least one first of the dimensions can correspond to the first imaging information and where at least one second of the dimensions can correspond to the second imaging information. At procedure 820, sharing of information between the first imaging information and second imaging information can be substantially prevented, and at procedure 825, a sparsity parameter can be applied to the first imaging information to remove undersampling artifacts from the first imaging information. At procedure 830, a first image and a second image can be generated based on the separated information. At procedure 835 an initial 3D volume can be generated based on the second imaging information which can be used to update the second image.

FIG. 9 shows a block diagram of an exemplary embodiment of a system according to the present disclosure. For example, exemplary procedures in accordance with the present disclosure described herein can be performed by a processing arrangement and/or a computing arrangement 902. Such processing/computing arrangement 902 can be, for example entirely or a part of, or include, but not limited to, a computer/processor 904 that can include, for example one or more microprocessors, and use instructions stored on a computer-accessible medium (e.g., RAM, ROM, hard drive, or other storage device).

As shown in FIG. 9, for example a computer-accessible medium 906 (e.g., as described herein above, a storage device such as a hard disk, floppy disk, memory stick, CD-ROM, RAM, ROM, etc., or a collection thereof) can be provided (e.g., in communication with the processing arrangement 902). The computer-accessible medium 906 can contain executable instructions 908 thereon. In addition or alternatively, a storage arrangement 910 can be provided separately from the computer-accessible medium 906, which can provide the instructions to the processing arrangement 902 so as to configure the processing arrangement to execute certain exemplary procedures, processes and methods, as described herein above, for example.

Further, the exemplary processing arrangement 902 can be provided with or include an input/output arrangement 914, which can include, for example a wired network, a wireless network, the internet, an intranet, a data collection probe, a sensor, etc. As shown in FIG. 9, the exemplary processing arrangement 902 can be in communication with an exemplary display arrangement 912, which, according to certain exemplary embodiments of the present disclosure, can be a touch-screen configured for inputting information to the processing arrangement in addition to outputting information from the processing arrangement, for example. Further, the exemplary display 912 and/or a storage arrangement 910 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entirety.
1. Ralf Ladebeck and Wolfgang Renz. Combined MR/PET system. U.S. Pat. No. 7,218,112 B2, US 20060293580 A1, CN 1868406 A, CN 100591274 C.

2. Shepp and Vardi. Maximum Likelihood Reconstruction for Emission Tomograph. IEEE Trans. Medical Imaging 1: 113-122 (1982).
3. Duarte, Sarvotham, Baron, Wakin and Baraniuk. Distributed Compressed Sensing of Jointly Sparse Signals. Conference Record of the Thirty-Ninth Asilomar Conference on Signals, Systems and Computers, 1537-1541 (2005).
4. Hudson and Larkin. Accelerated image reconstruction using ordered subsets of projection data. IEEE Trans. Medical Imaging, 13: 601-609 (1994).
5. Daubechies, Defrise and De Mol. An iterative thresholding algorithm for linear inverse problems with a sparsity constraint. Communications on Pure and Applied Mathematics 57: 1416-1457 (2004).
6. Kösters, Schäfers, and Wuebbeling. EMRECON: An expectation maximization based image reconstruction framework for emission tomography data. IEEE NSS/MIC: 4365-4368 (2011).
7. Lustig M, Donoho D, Pauly J M. Sparse MRI: The application of compressed sensing for rapid MR imaging. Magn Reson Med 58:1182-1195 (2007).
8. Vunckx, Atre, Baete, Reilhac, Deroose, Van Laere and Nuyts. Evaluation of three MRI-based anatomical priors for quantitative PET brain imaging. IEEE Trans. Medical Imaging 31: 599-612 (2012).
9. Ullisch, Scheins, Weirich, Rota Kops, Celik, Tellmann, Stoecker, Herzog and Shah. MR-Based PET Motion Correction Procedure for Simultaneous MR-PET Neuroimaging of Human Brain. PLoS ONE 7(11) (2012): e48149. doi:10.1371/journal.pone.0048149.

What is claimed is:

1. A non-transitory computer-accessible medium having stored thereon computer-executable instructions for generating at least one first image and at least one second image of at least one tissue which are different from one another, wherein, when a computer arrangement executes the instructions, the computer arrangement is configured to perform procedures comprising:
receiving combined information related to a combination of first positron emission tomography (PET) imaging information and first magnetic resonance (MR) imaging information data as a single data set;
separating the combined information into at least two dimensions into a separated information, at least one first of the at least two dimensions corresponding to the first PET imaging information and at least one second of the at least two dimensions corresponding to the first MR imaging information;
generating second PET imaging information and second MR information by performing a joint thresholding procedure on the first PET imaging information and on the first MR imaging information;
automatically modelling a resolution of the second PET imaging information using the second MR imaging information; and
generating the at least one first image and the at least one second image based on the second PET imaging information, (ii) the second MR information, and (iii) the modelled resolution of the second PET imaging information.

2. The computer-accessible medium of claim 1, wherein the first PET imaging information is based on a PET image of at least one patient, and wherein the computer arrangement is configured to model the resolution based on the PET image of the at least one patient using the second MR imaging information.

3. The computer-accessible medium of claim 1, wherein the computer arrangement is configured to automatically model the resolution of a PET scanner used to generate the first PET imaging information using a point spread function (PSF).

4. The computer-accessible medium of claim 3, wherein the PSF includes at least one blurring operator.

5. The computer-accessible medium of claim 1, wherein the at least two dimensions are at least four dimensions.

6. The computer-accessible medium of claim 1, wherein the computer arrangement is further configured to generate the at least two dimensions based on an optimization procedure.

7. The computer-accessible medium of claim 1, wherein the computer arrangement is further configured to prevent sharing of the first PET imaging information and the first MR imaging information with one another when the first PET imaging information and the first MR imaging information do not match.

8. The computer-accessible medium of claim 1, wherein the computer arrangement is further configured to generate the at least one first image and the at least one second image based on a MR data fidelity procedure performed on the first MR imaging information.

9. The computer-accessible medium of claim 8, wherein the computer arrangement is further configured to apply a sparsity parameter to the first MR imaging information to remove undersampling artifacts from the first MR imaging information.

10. The computer-accessible medium of claim 1, wherein the computer arrangement is further configured to generate an initial three-dimensional image volume from the first PET imaging information based on an expectation maximization (EM) procedure.

11. The computer-accessible medium of claim 10, wherein the computer arrangement is further configured to update the at least one first PET image using the EM procedure.

12. The computer-accessible medium of claim 1, wherein the computer arrangement is further configured to generate an initial estimation of the first MR imaging information by applying an adjoint of an MR forward operator to the first MR imaging information.

13. The computer-accessible medium of claim 12, wherein the first MR imaging information includes measured k-space raw data.

14. The computer-accessible medium of claim 1, wherein the computer arrangement is further configured to generate the at least one first image and the at least one second image based on a geometric normalization of the second PET imaging information.

15. The computer-accessible medium of claim 1, wherein the computer arrangement is further configured to generate the at least one first image and the at least one second image based on an attenuation correction of the second PET imaging information.

16. The computer-accessible medium of claim 1, wherein the computer arrangement is further configured to generate the at least one first image and the at least one second image based on an incoherence of artifacts in the separated information.

17. The computer-accessible medium of claim 1, wherein the computer arrangement is further configured to generate the at least one first image and the at least one second image based on a comparison of the second PET imaging information and the second MR imaging information.

18. The computer-accessible medium of claim 1, wherein the computer arrangement is further configured to generate the at least one first image temporally before the at least one second image.

19. The computer-accessible medium of claim 18, wherein the computer arrangement is further configured to generate the at least one second image based on the at least one first image.

20. The computer-accessible medium of claim 1, wherein the joint thresholding procedure is an iterative joint thresholding procedure.

21. The computer-accessible medium of claim 1, wherein the computer arrangement is further configured to generate the at least one first image and the at least one second image based on a PET data fidelity procedure performed on the first PET imaging information.

22. A method for generating at least one first image and at least one second image of at least one tissue which are different from one another, comprising:
- receiving combined information related to a combination of first positron emission tomography (PET) imaging information and first magnetic resonance (MR) imaging information data as a single data set;
- separating the combined information into at least two dimensions into a separated information, at least one first of the at least two dimensions corresponding to the first PET imaging information and at least one second of the at least two dimensions corresponding to the first MR imaging information;
- generating second PET imaging information and second MR information by performing a joint thresholding procedure on the first PET imaging information and on the first MR imaging information;
- automatically modelling a resolution of the second PET imaging information using the second MR imaging information; and
- generating the at least one first image and the at least one second image based on (i) the second PET imaging information, (ii) the second MR information, and (iii) the modelled resolution of the second PET imaging information.

23. A system for generating at least one first image and at least one second image of at least one tissue which are different from one another, comprising:
- a computer hardware arrangement configured to:
  - receive combined information related to a combination of first positron emission tomography (PET) imaging information and first magnetic resonance (MR) imaging information data as a single data set;
  - separate the combined information into at least two dimensions into a separated information, at least one first of the at least two dimensions corresponding to the first PET imaging information and at least one second of the at least two dimensions corresponding to the first MR imaging information;
  - generate second PET imaging information and second MR information by performing a joint thresholding procedure on the first PET imaging information and on the first MR imaging information;
  - automatically model a resolution of the second PET imaging information using the second MR imaging information; and
  - generate the at least one first image and the at least one second image based on (i) the second PET imaging information, (ii) the second MR information, and (iii) the modelled resolution of the second PET imaging information.

* * * * *

UNITED STATES PATENT AND TRADEMARK OFFICE
CERTIFICATE OF CORRECTION

| | | |
|---|---|---|
| PATENT NO. | : 10,002,444 B2 | Page 1 of 1 |
| APPLICATION NO. | : 14/696752 | |
| DATED | : June 19, 2018 | |
| INVENTOR(S) | : Knoll et al. | |

It is certified that error appears in the above-identified patent and that said Letters Patent is hereby corrected as shown below:

In the Specification

Add a paragraph to include a Statement Regarding Federally Sponsored Research, under Column 1, after the "Cross-Reference to Related Application(s)", starting on Line 16, with the following paragraph:
"STATEMENT REGARDING FEDERALLY SPONSORED RESEARCH
This invention was made with government support under grant numbers R01 EB000447 and R21 EB009435 awarded by The National Institutes of Health. Therefore, the government has certain rights in the invention."

Signed and Sealed this
Seventeenth Day of January, 2023

Katherine Kelly Vidal
*Director of the United States Patent and Trademark Office*